Oct. 27, 1964 J. F. BELL 3,154,742

U.H.F. TUNING DEVICE UTILIZING COAXIALLY ALIGNED COILS

Filed Sept. 12, 1961 2 Sheets-Sheet 1

INVENTOR
John F. Bell
BY
Francis W. Crotty
Atty.

U.H.F. TUNING DEVICE UTILIZING COAXIALLY ALIGNED COILS

Filed Sept. 12, 1961 2 Sheets-Sheet 2

INVENTOR.
John F. Bell
BY
Francis W. Crotty
Atty.

United States Patent Office 3,154,742
Patented Oct. 27, 1964

3,154,742

U.H.F. TUNING DEVICE UTILIZING COAXIALLY ALIGNED COILS

John F. Bell, Wilmette, Ill., assignor to Zenith Radio Corporation, a corporation of Delaware Filed Sept. 12, 1961, Ser. No. 137,577
7 Claims. (Cl. 325—465)

This invention is directed to ultra-high frequency tuning devices and concerns, in particular, what has come to be known in the industry as UHF tuning strips.

Tuning strips, as such, are now very well known in the art and are those components of a turret type tuner which may tune a receiver, usually a television receiver, to any selected one of a number of distinctly different signal channels. The average turret tuner accommodates twelve or thirteen such tuning strips removably positioned about the periphery of a pair of spaced discs. A detent mechanism facilitates adjusting the turret to any of a corresponding number of different angular positions in each of which a single tuning strip is operatively connected with the circuitry of the receiver. The operative association of the strip with the stages of the receiver is accomplished by contacts carried by the strip and brought into firm engagement with stationary contacts coupled to the receiver stages. The structure of a representative turret tuner is the subject of Patent No. 2,596,117 to Bell et al., issued May 13, 1952, and assigned to the same assignee as the present invention.

The present invention is an improvement over the structure of the Bell et al. patent, particularly in respect of tuning strips for the reception of signals in the UHF band. Since the UHF band is spaced considerably in the frequency spectrum from the VHF band, it is expedient to accomplish heterodyning of the received UHF signal by means of a converter other than that normally employed in VHF reception. As shown in the Bell et al. patent, for example, the UHF converter may be a crystal diode carried on the UHF strip and in this instance the signal output from the strip is at an intermediate frequency. When that type of operation is employed, the stages which serve as the radio-frequency amplifier and converter for the VHF reception are converted to stages of intermediate-frequency amplification, this being accomplished by appropriate frequency selective networks carried by the UHF strip and brought into operating relationship with those stages to effect the desired change in function. This, too, is disclosed in the Bell et al. patent.

While arrangements of this type have performed quite satisfactorily, difficulty has been experienced with the arrangement of components on the UHF strip in a fashion that minimizes stray reactance effects. Of course, stray reactances are undesirable and usually manifest themselves in degradation of the receiver performance. They may also cause excessive oscillator radiation. The present invention pertains to the specific arrangement of the UHF strip for improving performance by, among other things, reducing unwanted stray reactances and couplings.

The primary object of the invention, therefore, is to provide a new and improved tuning device for tuning a receiver to an ultra-high frequency signal channel.

It is a specific object of the invention to provide a UHF strip for a turret type tuner which is easily constructed and has superior performance to predecessor devices.

Another particular object of the invention is to provide a UHF strip for a turret tuner having reduced stray reactances and also reduced signal radiation properties.

A tuning device embodying the invention for selectively tuning a receiver to a predetermined ultra-high frequency signal comprises an elongated strip having first and second end portions. Antenna circuit means including an antenna coil and an antenna loop, are positioned on the strip adjacent the first end portion for receiving an ultra-high frequency input signal from an antenna. Mixer circuit means, including a mixer coil, are also positioned on the strip adjacent the antenna circuit means and in a substantially coaxial alignment with the antenna coil and antenna loop for accepting an input signal therefrom. There is a heterodyne injection coil likewise positioned on the strip adjacent its second end portion and in substantially coaxial alignment with the antenna and the mixer coils for developing a heterodyning signal. Finally, there are circuit means coupled between the injection coil and the mixer coil for deriving from the mixer circuit an intermediate-frequency signal representing the modulation of the input and the heterodyne signals.

The features of this invention which are believed to be novel are set forth with particularity in the appended claims. The invention, together with further objects and advantages thereof, may best be understood, however, by reference to the following description taken in conjunction with the accompanying drawings, in the several figures of which like reference numerals identify like elements, and in which:

Inasmuch as the invention is addressed to the structure of the UHF tuning strip, rather than to the associated circuitry of the receiver or the mechanics of the turret mechanism, the description and drawings pertain most particularly to the strip. Representative circuit arrangements for the associated stages of the television receiver, including a radio-frequency amplifier, the usual first detector or converter and the local oscillator, are disclosed in the above-identified Bell et al. patent. Certain other features embodied in the illustrated arrangement are disclosed in detail in other patents or applications identified hereinafter.

Figures 1, 2, 3:
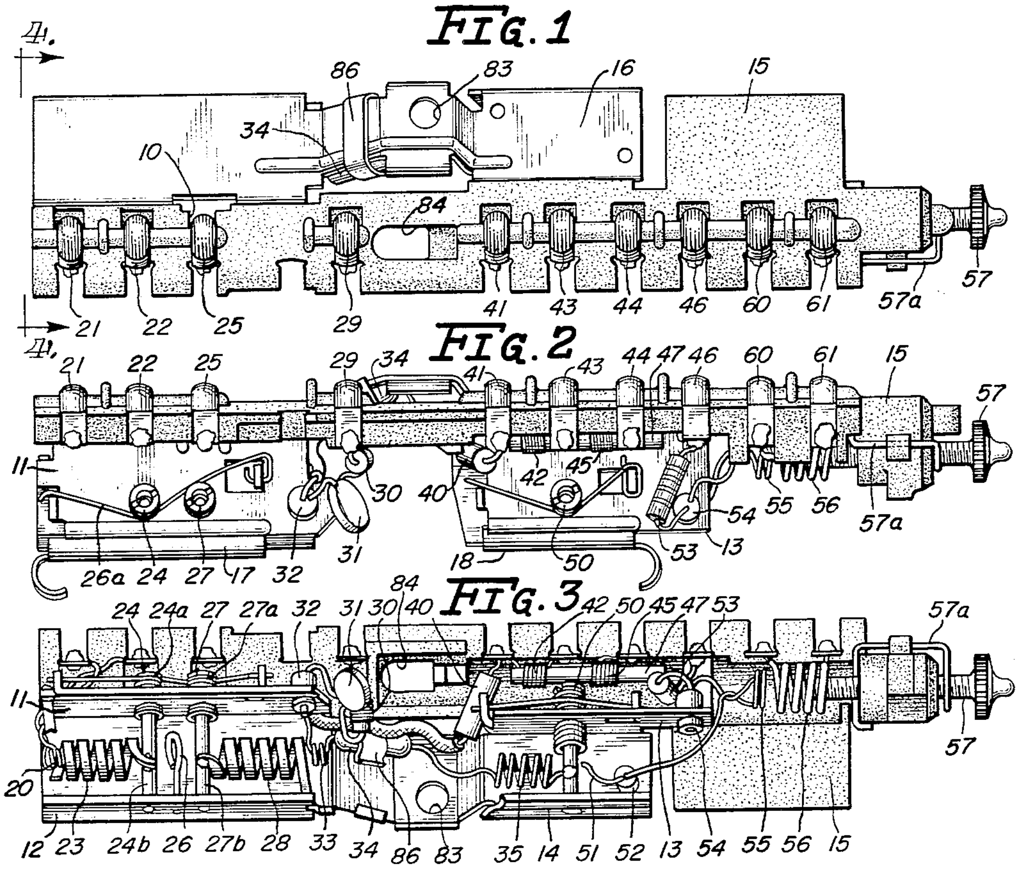
FIGURES 1 to 3 are perspective views, taken from different angles, of a UHF tuning strip embodying the invention.

Referring now more particularly to FIGURES 1 to 3, the UHF tuning strip there represented comprises an elongated base or support member 15 usually constructed of insulating material, preferably being molded of glass reinforced thermosetting plastic. Affixed to member 15 is a conductive chassis 16 for housing and shielding the high frequency portions of the tuner circuitry and a plurality of terminals or contacts through which the strip, when moved into operative position by adjustment of the turret, is connected to the appropriate stages of the television receiver. The terminals are in axial alignment as shown in FIGURE 1 and the first three members of the series are identified by numerals 21, 22 and 25. Two of these serve as independent ground terminals provided to improve the radiation properties as will be explained hereinafter.

The conductive chassis 16 is formed of metal and is in the nature of a channelway having a generally U-shaped cross section. It is, in effect, compartmentalized to present two compartments, one for the input signal and the other for the heterodyne signal and these compartments as well as their principal components are in substantially co-axial alignment which minimizes undesirable reactive coupling because of the increased spacing between the respective input and output circuits of the signal stages contained in the two shield compartments. In addition to a base, the channel is comprised of wall sections 11, 12 in the UHF compartment and other wall sections 13, 14 in the heterodyne signal compartment. Between these compartments the channel is depressed to form what may be termed a well as illustrated in FIGURE 3 and certain components, such as a mixer diode, are received there. The well permits accommodating the mixer crystal, for example, without requiring that the end plate or disc of the turret be cut away in order to make room for the crystal. With the well, the crystal is positioned on the periphery of the turret disc when the strip is in position. A tab or extension 10 connects chassis 16 to ground terminal 25.

Figure 6:
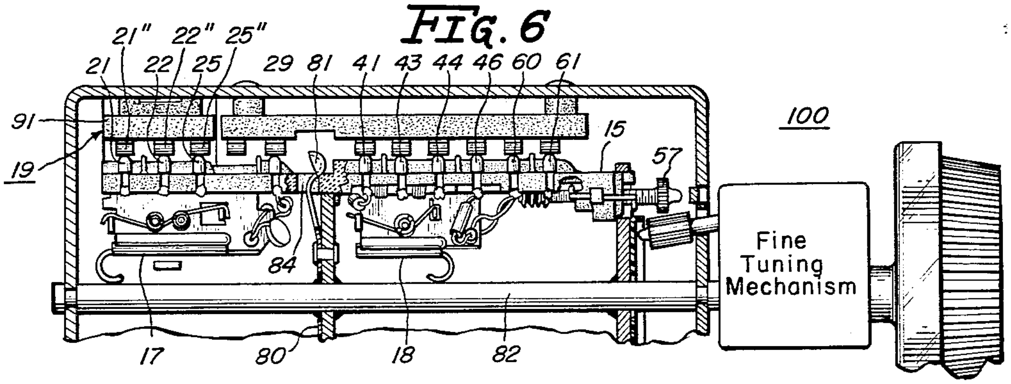
FIGURE 6 represents a tuning strip carried by the turret and in operative association with the stages of the receiver.

Each of the shield compartments is provided with a removable closure or cap, these being designated 17 at the UHF compartment and 18 at the heterodyne compartment. Each cap has a hook-shaped or resilient finger termination which may engage the turret shaft 82 to establish a further ground connection when the strip is positioned in the turret as represented in FIGURE 6. Each cap may be removably affixed to its compartment by a channelway formed in the side walls thereof.

Antenna circuit means are positioned on the strip adjacent one end portion for receiving an ultra-high frequency input signal from a signal receiving antenna. This means includes an antenna loop 20 positioned within UHF compartment 11, 12 and having its ends connected to strip terminals 21 and 22. Terminal 21 is the second ground terminal of the strip through which the antenna is effectively isolated from the remainder of the receiver circuitry since it does not share a common ground as has been the practice heretofore. Terminals 21 and 22 serve to connect loop 20 to an antenna through a balun impedance transformer to be considered subsequently.

Figure 4:
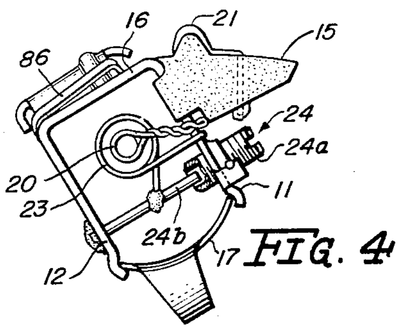
FIGURE 4 is an end view taken along lines 4—4 of FIGURE 1.

Also positioned within the UHF compartment is an antenna coil 23 extending co-axially of the strip and in co-axial alignment with loop 20. One end of coil 23 is directly grounded to the chassis while the other end connects a tuning capacitor 24 selected in relation to the inductance of the coil to tune the coil to a chosen UHF channel. The structure of capacitor 24 shows more clearly in FIGURE 4 where it will be seen that the capacitor comprises a ceramic rod **24*b*. The end of the rod which projects through the shield wall 12 is silver coated to facilitate making a good electrical connection with the wall. The rod is also silver coated from the point where coil 23 connects with the rod continuously to its opposite end, leaving a gap of insulation between the silvered portions. The free end of the rod may be considered as one electrode of a condenser; the other electrode of which is a screw 24*a* having an externally threaded end received by chassis wall 11 so that rotation of the screw causes it to move axially. The end of the screw which projects within the shield compartment has a channel which receives the silvered end of ceramic rod 24*b*.** The screw serves as the other electrode of the condenser and the capacitance which it represents is adjustable to tune the antenna coil as desired.

A UHF signal selected by the antenna system is converted to a suitable intermediate frequency by mixer circuit means also positioned on the strip adjacent the antenna circuitry. Usually the mixer circuit is a tuned circuit coupled to a diode or other non-linear element which receives the UHF signal and a heterodyne signal and modulates them to develop the IF signal. While the mixer element may be located on a stationary part of the turret tuner with contacts for engaging the UHF strip to operatively associate it with mixer components carried on the strip, for convenience the arrangement shown carries the mixer crystal or diode 34 on the strip. Actually, the diode is positioned within the well of chassis 16 as explained above.

Additionally, the mixer circuit includes a mixer coil 28 positioned within the UHF compartment in co-axial alignment with antenna coil 23. One end of coil 28 is grounded to the chassis and the other end connects with a tuning capacitor 27 which may be identical in construction to capacitor 24. As thus far described, the circuitry from the antenna toward mixer crystal 34 includes a pair of tuned coupled circuits and the coupling between them is largely capacitive because of the alignment and relatively separation of coils 23 and 28. The band pass characteristic of the strip is dependent upon the coupling between these circuits and a capacitive shield 26 is interposed between the antenna and mixer coils to facilitate adjustment of the pass band. Structurally, this is a hook-shaped conductor grounded to chassis wall 12 and of such stock as to be readily flexed manually to control the inter-coil capacitance. Of course, once coils 23 and 28 have been properly tuned, it is desirable to lock the adjustable elements of the capacitors against further movement and this is accomplished by a wire spring **26*a* which is shaped to press against screw elements 24*a* and 27*a* and is anchored to projections struck out of chassis wall 11.**

The mixer circuit, at least so far as the UHF input is concerned, is completed by a mixer loop 33 also positioned within the UHF compartment so that all of the coils therein, namely coils 20, 23, 28 and 33 are in essentially co-axial alignment. Loop 33 is in relatively close physical proximity to the adjacent end of mixer coil 28 and their coupling is largely inductive. One end of loop 33 connects with the anode of mixer diode 34 and the other end is extended by way of a feed-through capacitor 32 to a blocking condenser 31. The sleeve of the feed-through condenser is supported in compartment wall 11 as shown in FIGURE 3.

The heterodyne signal supply is arranged on the opposite end of the tuning strip. It includes an oscillator coil 56 which connects with strip terminals 60 and 61. This coil is slug tuned by means of a slug 57 the free end of which projects beyond the tuning strip and has a gear termination to accommodate vernier fine tuning. A wire **57*a* is formed to have one end extend over the tuning slug and the opposite end extend under the slug but with both ends received by the threads of the slug. Rotation of the slug causes it to move axially of coil 56** all as described and claimed in copending application, Serial No. 89,422, filed February 15, 1961, now Patent No. 3,058,075, issued October 9, 1962, in the name of Eugene J. Polley, and assigned to the assignee of the present invention.

The signal developed by the local oscillator (not shown) including coil 56 is supplied to a frequency multiplier circuit wherein a heterodyne signal of appropriate frequency is developed. The frequency multiplier is of the diode type including a diode 52 housed within compartment 13, 14, having one end connected to chassis ground and the opposite end connected to an injection loop 55. This loop is co-axial with oscillator coil 56 and is positioned sufficiently close to be efficiently coupled thereto. The opposite end of the loop connects to a capacitor 54 and to one terminal of a resistor 53. The other terminal of that resistor connects to the strip chassis which is a ground plane. The capacitor 54 is shown as being of the feed through type but this is a mere matter of convenience; any other form of capacitor will suffice. The injection loop 55 is tuned by its distributed capacitance and diode capacitance to represent a high impedance to the multiplied frequency or harmonic of the local oscillator which is developed in the circuit of diode 52 and this prevents the diode from being short-circuited by the loop.

The multiplied frequency signal to be used in heterodyning the UHF signal is selected by a multiplier coil 35 which is tuned by capacitance 50. This coil is positioned within the heterodyne compartment 13, 14 in substantially co-axial alignment with the antenna and mixer coils and its structure as well as that of tuning capacitance 50 are generally the same as described in considering the UHF section. A tap on coil 35 connects to the cathode of mixer diode 34 and the injection circuit from multiplier diode 52 to the mixer diode is completed by a capacitive coupling from the multiplier circuit to coil 35. The coupling is provided by a conductor 51 which is positioned in coupled relation to the junction of coil 35 and capacitor 50 and constitutes therewith an adjustable coupling capacitor.

Finally, there are circuit means coupled between injection coil 35 and mixer coil 28 for deriving from the mixer circuit an intermediate-frequency signal representing the modulation of the UHF and heterodyne signals. This circuit means comprises the takeoff through loop 33 across feed-through capacitor 32 to blocking condenser 31 and an inductor 30. Inductor 30 connects to terminal 29 of the strip which in turn couples to the input electrode or grid of the radio-frequency stage of the television receiver when the strip is in its operative position. For this condition, the input capacitance of the radio-frequency stage in conjunction with inductor 30 and capacitor 32 form a $\pi$ network which transforms the impedance of the mixer crystal to the optimum source impedance of the RF stage for low noise signal transfer.

It will be apparent from the description thus far that there are two principal signal paths on the strip. One is a UHF signal path which commences at the left end of the strip as viewed in FIGURE 3 and proceeds to the center where mixer diode 34 is located. The other path which serves to apply the heterodyne signal to the mixer commences at the opposite end of the strip and proceeds toward the center. The intermediate-frequency signal obtained from the mixer is taken off at the center where the mixer diode is located. This physical relationship facilitates minimizing unwanted stray reactances.

The other components included on the strip are the coils for converting the RF and mixer stages of the receiver to IF amplifiers during UHF reception. The IF coil assembly comprises a pair of coils 42 and 45 mounted on a core 47. Coil 42 connects with terminals 41 and 43 through which it may be coupled to the output or plate circuit of the RF stage. Coil 45 connects with terminals 44 and 46 of the strip through which it may be coupled to the input electrodes or grid of the stage which in VHF operation functions as the converter.

Additionally, a resistor 40 is connected in series with strip terminal 41 and mixer diode 34. Through this arrangement a bias is applied to the mixer diode to optimize its operation as explained in Patent No. 2,640,919 issued June 2, 1953, in the name of John F. Bell et al. and assigned to the same assignee as the present invention. The potential supply for the mixer bias is the plate excitation potential of the RF stage of the receiver.

Figure 5:
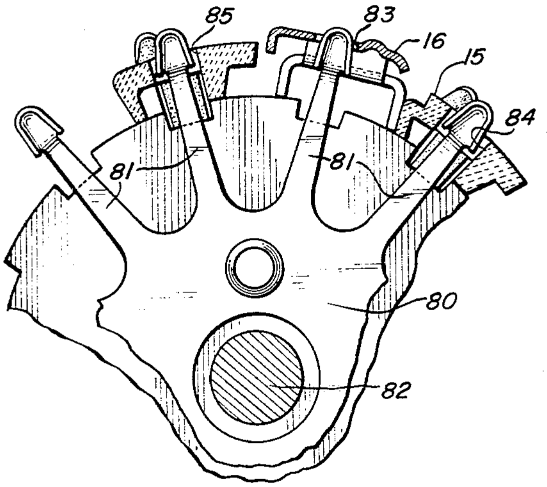
FIGURE 5 is a fragmentary sectional view illustrating the mechanism for capturing and holding strips on the turret.

Physically the strip is so wide that it occupies the position normally occupied by two VHF strips on the turret. This is illustrated in FIGURE 5 where numerals 15 and 16 show the expanse of the UHF turret strip as compared with the width of a VHF strip shown at 85. The end of the UHF strip adjacent tuning slug 57 is shaped to be received in a recess in one of the pair of discs constituting the turret. A pair of apertures 83 and 84 provided in chassis 16 and support member 15 respectively and located approximately midway of each permits the strip to receive tines 81 of a spider affixed to the opposite disc of the turret. These tines are flexible elements and after passing through apertures 83 and 84 overlap the adjacent part of the strip to hold it in position. The tine 81 which projects through chassis opening 83 may be considered as an end shield interposed between the UHF and heterodyne compartments of the chassis further to complete their isolation from one another. It will also be apparent that mixer diode 34 which is held within the well of the chassis by a band 86 is close to the shield member constituted of tine 81 and the signal transfer between the UHF compartment on the one hand and the heterodyne compartment on the other is through the connection from coil 35 to diode 34.

Figure 7:
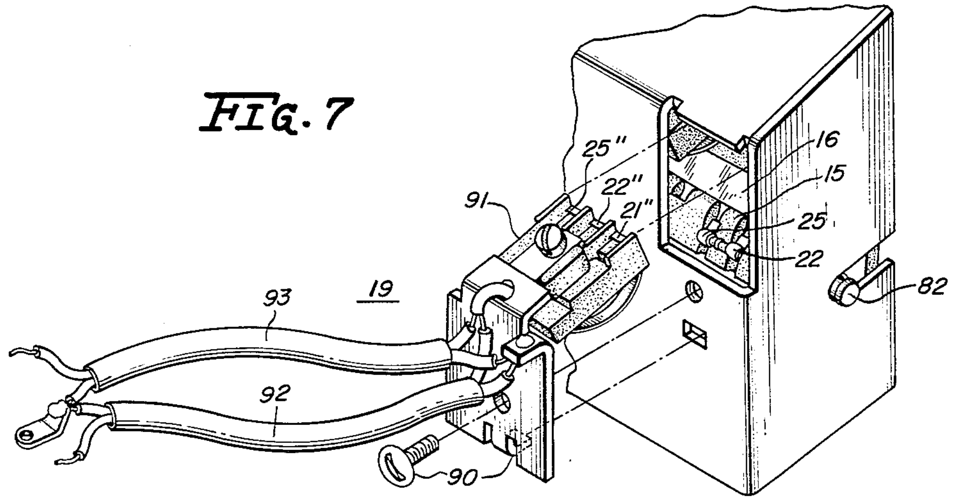
FIGURE 7 shows the UHF antenna coupling arrangement for the tuner.
Figure 8:
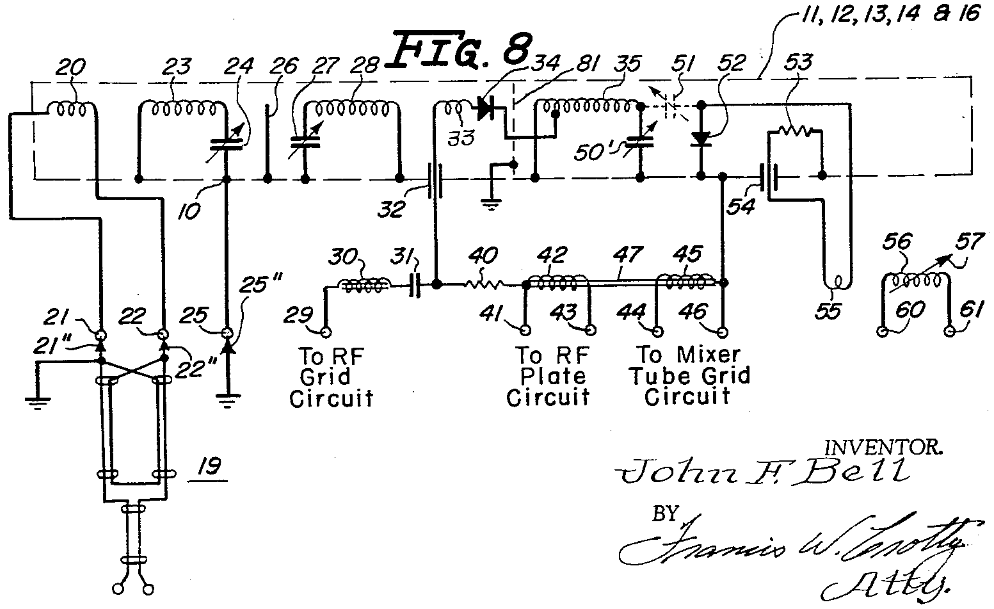
FIGURE 8 is a schematic circuit diagram representing the electrical components accommodated by the UHF strip.

Of course, if in a particular installation there is no UHF station available there is no requirement for UHF strips and for this reason the turret is arranged to accept a UHF terminal block as an accessory 19. The tuner housing has an opening which may receive the contact assembly comprising an insulating block 91 which may be locked in position by way of a machine screw 90 and a tongue and slot locking arrangement shown in FIGURE 7. Block 91 has three stationary contacts 21″, 22″ and 25″ to engage similarly designated contacts of the UHF strip. As shown in FIGURE 8, contacts 21″ and 25″ are independent ground connections and contact 22″ in conjunction with contact 21″ accept connections from a UHF antenna.

The antenna circuit includes a balanced transformer comprising two sections 92, 93 of a conventional 150 ohm transmission line. One pair of ends of lines 92, 93 is connected in series while the remaining ends are connected in parallel. This arrangement forms a 150 ohm balance-to-unbalance transformer which has an impedance approximately equal to the mean of a 300 ohm transmission line which usually is the antenna lead-in and the impedance presented at contacts 21 and 22 of the strip which conveniently can be in the order of 70 ohms. The impedance transformer is tuned to approximately the middle of the UHF band and concurrently serves as a band pass filter to reject other signals. In particular, it is effective in avoiding interference on the part of the police broadcast band without requiring a separate filter for that purpose as has been the past practice.

The circuitry represented by the UHF strip is shown in FIGURE 8 and the similarity of reference numerals renders a further description of these components unnecessary.

In operation, the UHF strip is first pre-tuned at the factory by adjustment of capacitors 24, 26, 27, 50 and 51 to select a particular UHF channel and to produce therefrom an intermediate-frequency signal corresponding to the desired IF of the receiver. When such a channel is to be accepted, the turret is manipulated to bring the UHF strip into the position shown in FIGURE 6. The mating of the contacts of the strip with the family of stationary contacts completes the circuit connections required. Specifically, the stages of the receiver which function as an RF amplifier and a mixer during VHF reception are converted to stages of IF amplification. The local oscillator is tuned by coil 56 to generate a signal of appropriate value such that a selected harmonic developed in the multiplier crystal 52 and selected by injection coil 35 has the correct frequency value for heterodyning. The UHF antenna is matched at the selected UHF frequency to mixer 34 through antenna loop 20 and the coupled tuned circuits 23 and 28. The concurrent application of the UHF signal and the heterodyne signal derived from multiplier crystal 52 develops an IF signal which is applied from terminal 29 to what is now an IF amplifier for translation in the usual fashion through the other stages of the receiver.

The arrangement has a number of distinct advantages. The coupling from the local oscillator to the multiplier circuit is simplified and yet the multiplier diode is protected against shortcircuiting. Effective isolation of the antenna from the mixer and oscillator stages is accomplished by the use of independent grounds without complication in the structure of the coils or the antenna circuit. Since the ground for the antenna is independent from the ground return of the local oscillator, there is little likelihood of radiation. The impedance transforming antenna input accomplishes impedance matching of the antenna circuit in a simple and efficient manner and also affords necessary protection against interfering signals. Finally and of great importance, most of the stray reactance is minimized as previously explained.

While a particular embodiment of the present invention has been shown and described, it is apparent that changes and modifications may be made therein without departing from the invention in its broader aspects. The aim of the appended claims therefore, is to cover all such changes and modifications as fall within the true spirit and scope of the invention.

I claim:

1. A tuning device for selectively tuning a receiver to a predetermined ultra-high frequency signal comprising: an elongated tuning strip having first and second end portions; antenna circuit means, including an antenna coil and an antenna loop, positioned on said strip adjacent said first end portion for receiving an ultra-high frequency input signal from a signal receiving antenna; mixer circuit means, including a mixer coil positioned on said strip adjacent said antenna circuit means and in substantially coaxial alignment with said antenna coil and antenna loop for receiving said input signal from said antenna circuit means; a heterodyne signal injection coil positioned on said strip adjacent said second end portion and in substantially coaxial alignment with said antenna and mixer coils for developing a heterodyne signal; and circuit means coupled between said injection coil and said mixer circuit for deriving from said mixer circuit an intermediate-frequency signal representing the modulation of said input and said heterodyne signals.

2. A tuning device for selectively tuning a receiver to a predetermined ultra-high frequency signal comprising: an elongated tuning strip having first and second end portions; antenna circuit means positioned on said strip adjacent said first end portion for receiving an ultra-high frequency input signal from a signal receiving antenna; mixer circuit means, including a mixer coil, positioned on said strip adjacent said antenna circuit for receiving said input signal therefrom; oscillator circuit means, including an oscillator coil positioned on said strip adjacent said second end portion, for supplying a locally generated heterodyne signal; multiplier circuit means, including a multiplier coil which is positioned on said strip in substantially coaxial alignment with and located between said mixer coil and said oscillator coil, and which is coupled to said oscillator coil, for receiving and multiplying the frequency of said heterodyne signal; and circuit means coupled between said multiplier circuit and said mixer circuit for deriving from said mixer circuit an intermediate frequency signal representing the modulation of said input and said multiplied-frequency signals.

3. A tuning device for selectively tuning a receiver to a predetermined ultra-high frequency comprising: an elongated tuning strip having first and second end portions; antenna circuit means, including a tuned antenna coil positioned on said strip adjacent said first end portion, for receiving an ultra-high frequency input signal from a signal receiving antenna; mixer circuit means, including a tuned mixer coil and a mixer crystal positioned on said strip adjacent and in substantially coaxial alignment with said antenna coil, for receiving said input signal therefrom; shield means projecting from said strip intermediate said tuned antenna and mixer coils for determining the bandpass characteristic thereof; a heterodyne signal injection coil positioned on said strip adjacent said second end portion and in substantially coaxial alignment with said antenna and mixer coils for developing a heterodyne signal; and circuit means coupling said injection coil and said mixer crystal and for deriving from said mixer circuit an intermediate-frequency signal representing the modulation of said input and said heterodyne signals.

4. A tuning device for selectively tuning a receiver to a predetermined ultra-high frequency comprising: an elongated tuning strip having first and second shield compartments separated by a shield member which substantially isolates said compartments from one another; antenna circuit means, positioned in said first compartment a maximum distance along said strip from said shield member, for receiving an ultra-high frequency input signal from a signal receiving antenna; mixer circuit means, including a mixer coil, positioned on said strip adjacent said antenna circuit for receiving said input signal therefrom; a mixer crystal, forming a portion of said mixer circuit means, positioned on said strip between said mixer coil and adjacent said shield member; a heterodyne signal injection coil positioned on said strip within said second compartment and in substantially coaxial alignment with said antenna and mixer coils for developing a heterodyne signal; and circuit means for extending a coupling connection from said injection coil to said mixer crystal for deriving from said mixer circuit an intermediate-frequency signal representing the modulation of said input and said heterodyne signals.

5. A tuning device for selectively tuning a receiver to a predetermined ultra-high frequency comprising: an elongated tuning strip; antenna circuit means positioned on said strip for receiving an ultra-high frequency input signal from a signal receiving antenna; mixer circuit means positioned on said strip and coupled to said antenna circuit for receiving said signal therefrom; oscillator circuit means for generating an oscillator heterodyne signal comprising an oscillator coil positioned on said strip; multiplier circuit means, including a multiplier diode, positioned on said strip and coupled to said mixer circuit for producing a multiplied frequency heterodyne signal and for applying it to said mixer circuit to develop an intermediate frequency signal representing the modulation of said input and said multiplied frequency signals; and a signal pickup loop coupling said heterodyne signal from said oscillator coil to said multiplier diode having a relatively high reactance value at said multiplied frequency compared to its reactance at said oscillator frequency.

6. A tuning device for selectively tuning a receiver to a predetermined ultra-high frequency comprising: a tuning strip having a plurality of terminals, including two ground terminals; an antenna input loop supported at end of said strip, connected to one of said ground terminals and also connected to a receiving antenna by way of another one of said plurality of terminals, said one ground contact serving as an antenna signal return path and further including a metallic member serving as a signal return chassis for predetermined components positioned on the strip and coupled to the other ground terminal; a coil mounted on said strip for generating a heterodyning signal; circuit means coupled between said antenna loop and said coil for developing an intermediate frequency signal representing the modulation of said input and said heterodyne signals; a switching station, including a supporting structure, to which said tuning strip may be selectively moved, and two mating contacts coupled to said supporting structure and both electrically coupled to a plane of reference potential, one of said mating contacts positioned for engagement with said one ground terminal and the other with said other ground terminal to prevent heterodyne signals resulting on said chassis from stray coupling between said chassis and said coil from combining with said antenna loop return currents on said strip.

7. A tuning device for selectively tuning a receiver to a predetermined ultra-high frequency signal comprising: an elongated tuning strip having a conductive chassis and having a plurality of terminals including two independent ground terminals one of which is connected to said chassis; an antenna loop supported at one end of said strip, having one terminal connected to the other of said ground terminals and having another terminal for connection to a receiving antenna; a tuned antenna coil in co-axial alignment with said antenna loop and grounded to said chassis; a mixer circuit including a mixer coil tuned to the same frequency as said antenna coil and supported in co-axial alignment therewith and grounded to said chassis; a capacitive shield interposed between said coils and grounded to said chassis for adjusting the band pass characteristic of the tuning device; an injection circuit including an injection coil supported in co-axial alignment with said antenna and mixer coils and grounded to said chassis supplying a heterodyne signal to said mixer; and means positioned between said mixer and injection coils for deriving an intermediate-frequency signal representing the modulation of a received signal selected by said antenna coil and said heterodyne signal.

References Cited in the file of this patent

UNITED STATES PATENTS

| | | |
|---|---|---|
| 2,596,117 | Bell et al. | May 13, 1952 |
| 2,821,624 | Koch | Jan. 28, 1958 |
| 2,908,814 | Bell | Oct. 13, 1959 |